(12) United States Patent
Felix

(10) Patent No.: US 10,197,052 B2
(45) Date of Patent: Feb. 5, 2019

(54) VARIABLE FREQUENCY DRIVE APPARATUS

(71) Applicant: LITTELFUSE, INC., Chicago, IL (US)

(72) Inventor: Sheldon Felix, Saskatchewan (CA)

(73) Assignee: LITTELFUSE, INC., Chicago, IL (US)

( * ) Notice: Subject to any disclaimer, the term of this patent is extended or adjusted under 35 U.S.C. 154(b) by 275 days.

(21) Appl. No.: 15/145,888

(22) Filed: May 4, 2016

(65) Prior Publication Data

US 2016/0336893 A1 Nov. 17, 2016

Related U.S. Application Data

(60) Provisional application No. 62/159,386, filed on May 11, 2015.

(51) Int. Cl.
*H02P 27/16* (2006.01)
*F04B 49/20* (2006.01)
*F04D 25/16* (2006.01)
*H05K 7/20* (2006.01)

(52) U.S. Cl.
CPC ............ *F04B 49/20* (2013.01); *F04D 25/166* (2013.01); *H05K 7/20909* (2013.01)

(58) Field of Classification Search
CPC ........... H05K 7/20909; H05K 7/20918; H05K 7/20163
See application file for complete search history.

(56) References Cited

U.S. PATENT DOCUMENTS

| 4,520,425 A * | 5/1985 | Ito ...................... H05K 7/20918 165/80.2 |
| 8,188,694 B2 * | 5/2012 | Tallam ................ H02M 5/4585 318/400.3 |
| 2007/0035261 A1 | 2/2007 | Amorino et al. |
| 2010/0034665 A1 | 2/2010 | Zhong et al. |
| 2012/0322358 A1 | 12/2012 | Wendorski et al. |
| 2014/0298846 A1 | 10/2014 | Taras et al. |
| 2015/0285255 A1 * | 10/2015 | Tsujimoto ............. H02M 7/003 417/44.1 |

OTHER PUBLICATIONS

ISR and Written Opinion dated Aug. 8, 2016 in corresponding International Application No. PCT/US2016/031429.

* cited by examiner

*Primary Examiner* — Mukund G Patel

(57) ABSTRACT

An apparatus may include an enclosure and a variable frequency drive (VFD) assembly disposed within the enclosure, and comprising at least one VFD. The apparatus may also include a heat sink thermally coupled to the VFD assembly, and a fan system disposed adjacent the VFD assembly and including at least one fan arranged to direct air flow to the heat sink and at least one fan to direct air flow from the heat sink.

3 Claims, 4 Drawing Sheets

VARIABLE FREQUENCY DRIVE APPARATUS

RELATED APPLICATIONS

This application claims priority to U.S. provisional patent application No. 62/159,386, filed May 11, 2015, and incorporated by reference herein in its entirety.

FIELD OF THE DISCLOSURE

This disclosure relates generally to the variable frequency drives and in particular to variable frequency drives for mining operations.

BACKGROUND OF THE DISCLOSURE

Drives for operating conveyors and other similar apparatus may employ variable AC frequency to control motor speed for operating the apparatus. In the mining industry, variable frequency drives (VFDs) may be used to start and adjust speed of motors used to power excavators, conveyors, mills, pumps, and other apparatus. Known variable VFD apparatus may operate using an AC power input that is transformed into a DC voltage signal. The DC voltage in turn may be transformed into a sinusoidal output whose frequency is proportional to the motor speed of a motor to be driven.

The transformation between AC and DC power in a VFD apparatus may entail substantial heating, where heat generated by the VFD apparatus is to be dissipated to avoid overheating of the VFD apparatus. In order to dissipate heat during operation, a heat sink may be provided with a VFD apparatus. In some scenarios, the heat sink may provide an effective means for removing heat generated by the VFD apparatus. In some applications, such as in certain mining operations, the ambient of a VFD apparatus may contain a high degree of dust or other particulate matter, where the dust may collect on surfaces of the VFD apparatus. Eventually dust may accumulate on surfaces such as heat sink surfaces. This accumulation may degrade operation of a heat sink and therefore may limit performance of the VFD apparatus.

It is with respect to the above the present disclosure is provided.

BRIEF SUMMARY

In one embodiment, an apparatus may include an enclosure; a variable frequency drive (VFD) assembly disposed within the enclosure, and comprising at least one VFD; a heat sink thermally coupled to the VFD assembly; and a fan system disposed adjacent the VFD assembly and including at least one fan arranged to direct air flow to the heat sink and at least one fan to direct air flow from the heat sink.

In another embodiment, a VFD apparatus may a VFD enclosure and a variable frequency drive (VFD) assembly disposed within the enclosure, and comprising at least one VFD. The VFD apparatus may further include a cooling enclosure disposed adjacent the VFD enclosure, the cooling enclosure comprising: a heat sink, the heat sink being thermally coupled to the at least one VFD; and a fan system to direct a flow of air from outside the cooling enclosure and through the heat sink.

BRIEF DESCRIPTION OF THE DRAWINGS

By way of example, specific embodiments of the disclosed device will now be described, with reference to the accompanying drawings, where:

FIGS. 2A to 2E depict different views of a VFD apparatus according to further embodiments of the disclosure.

DETAILED DESCRIPTION

Figure 1A:
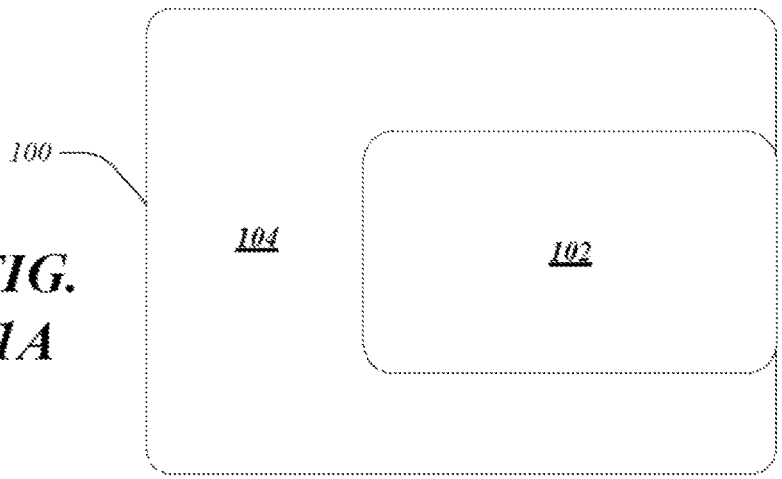
FIG. 1A is a block diagram of a top view of an apparatus according to embodiments of the present disclosure.

In various embodiments, an improved variable frequency drive (VFD) apparatus is provided. Some embodiments are directed to a mine-duty modular VFD package that addresses cooling issues in a high particulate environment. In various embodiments, a VFD apparatus may include a plurality of enclosures including a main enclosure that encapsulates a variable frequency drive. The term "VFD apparatus" as used herein may refer to a device or system that includes a variable frequency drive(s), enclosure(s), and cooling systems associated with the variable frequency drive (also referred to herein as "VFD" or "VFD drive"). A variable frequency drive may include an adjustable-speed drive used to control AC motor speed, torque, or a combination of motor speed and torque. This control may be accomplished by varying motor input frequency and voltage. In various embodiments, one variable frequency drive may be included in a main enclosure, while in other embodiments multiple variable frequency drives may be included in a modular fashion within the main enclosure. Examples of suitable VFDs in the present embodiments include commercially available VFDs selected to give maximum performance in mining conditions.

In various embodiments, the main enclosure may be designed according to National Electrical Manufacturers Association enclosure type 4 or type 12. The embodiments are not limited in this context. The main enclosure may allow the VFD electronics to be sealed from ambient conditions where the VFD apparatus is employed. This may provide a particular advantage for operation in mining applications or other high particulate environments as discussed further below.

In various embodiments, the VFD apparatus may further include a runner style or flat bottom tub, including optional fork lift pockets, providing convenient means for transporting the VFD apparatus.

According to embodiments of the present disclosure, a VFD apparatus may be provided with a cooling system that includes a heat sink and fan system. The cooling system may utilize a flange-mounted heat sink that is attached to a VFD or otherwise thermally coupled to a VFD. For example, the VFD may be attached adjacent a wall of the main enclosure or may at least partially protrude through a back wall of the main enclosure, and connect to the heat sink. In various embodiments, the cooling system may be included in a secondary enclosure. The fan system may include a forced cooling fan that directs air flow to the heat sink. The fan system may further include a fan that directs air flow away from the heat sink. The secondary enclosure may surround the main enclosure on at least one side of the main enclosure, and in some embodiments may surround the main enclosure on three sides.

The cooling enclosure including fan system need not be provided with filters. In environments where excessive dust or other particulate matter may be present, the providing of a NEMA type 4 or NEMA type 12 main enclosure allows the VFD electronics to be sealed from the dusty high-particulate environment. In some examples, the secondary enclosure may not be as well sealed from ambient dust or particulate matter as the main enclosure. In accordance with various embodiments, the provision of a high efficiency AC or DC variable speed fan in the secondary cooling enclosure allows for enhanced cooling of the VFD and further provides the additional advantage over conventional VFD apparatus in that the cooling efficiency may be maintained for longer duration. In other words, in scenarios in which particulate matter may continually or intermittently enter the secondary enclosure and deposit on surfaces including the heat sink, the fan system may act to remove the particulate manner and prevent excessive accumulation. This preserves the efficient operation of the heat sink by allowing proper air flow over heat sink surfaces where such surfaces may otherwise become obstructed by accumulating particulate matter. In particular embodiments where a filterless fan system is provided adjacent a heat sink, constant filter changing and other cleanings characteristic of conventional operation of VFDs in dusty environments may be prevented.

In various embodiments, multiple variable frequency drive packages may be linked through various communication methods (Ethernet, modbus, profibus, direct link, etc.) to provide load sharing, load shedding and controlled startup synchronization. In one mode of operation a VFD may provide overload protection of the drive, with ground fault systems included to provide ground fault protection. Supplemental overload protection may also be provided using motor protection relays.

FIG. 1A depicts a top view of a VFD apparatus 100 according to various embodiments. The VFD apparatus may include a first enclosure 102 that houses a VFD as discussed below. The first enclosure 102 may be arranged to protect VFD components including VFD electronics from attack from ambient particulate matter. The VFD apparatus 100 may include various other enclosures or compartments. In the example of FIG. 1A, an enclosure 104 is illustrated that may extend around various sides of the first enclosure 102. In some embodiments, the enclosure 104 may include multiple compartments or enclosures.

Figure 1B:
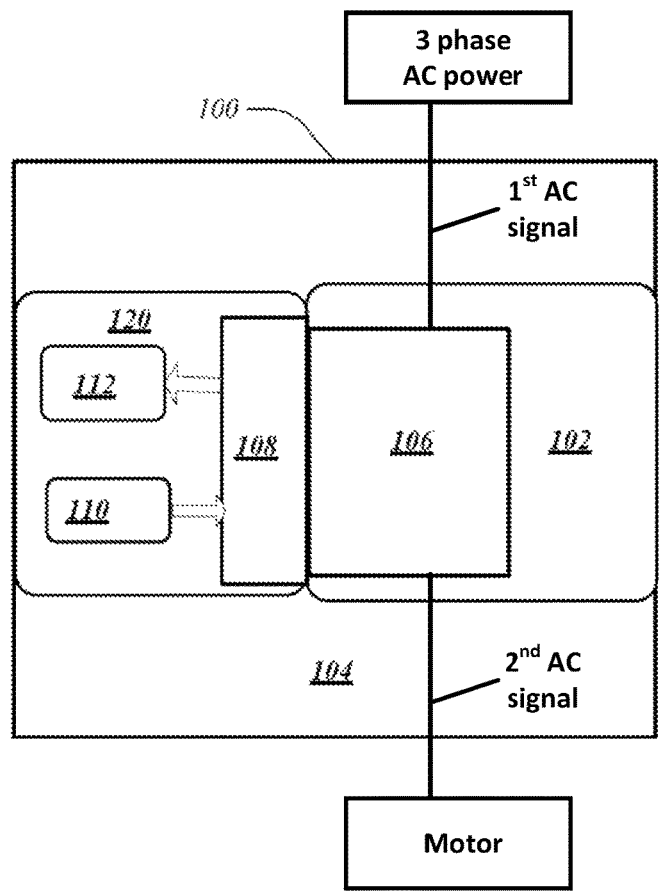
FIG. 1B is a side view of an apparatus according to embodiments of the present disclosure.

FIG. 1B depicts a top view of a variant of the VFD apparatus 100. It may be understood that the various components shown may not necessarily be visible from a top view when enclosure wall(s) are in place. As illustrated, a VFD 106 is located within the first enclosure 102. In some embodiments, the VFD 106 may be a VFD assembly including a master VFD and a slave VFD, where the master VFD is communicatively linked to the slave VFD over an electrical communications system, and the slave VFD includes logic to adapt operation of a VFD motor within the slave VFD in response to a signal received from the master VFD. In operation, at least one VFD of a VFD assembly as represented by VFD 106 may be adapted to receive a first AC signal from a three phase AC power supply and to output a second AC signal for driving a motor.

As further shown in FIG. 1B, a heat sink 108 is located adjacent the VFD 106. The heat sink 108 may be located within a cooling enclosure 120. In some embodiments, the heat sink 108 may be a heat sink assembly having a plurality of heat sinks. The cooling enclosure 120 may further include a fan system that includes a first fan 110 and second fan 112. In one example, the first fan 110 may direct air flow to the heat sink 108, while the second fan 112 pulls air from the heat sink 108. This operation may help cool the VFD 106 as well as remove particulate matter from the heat sink 108 or prevent particulate matter from accumulating on the heat sink 108.

Figure 2A:
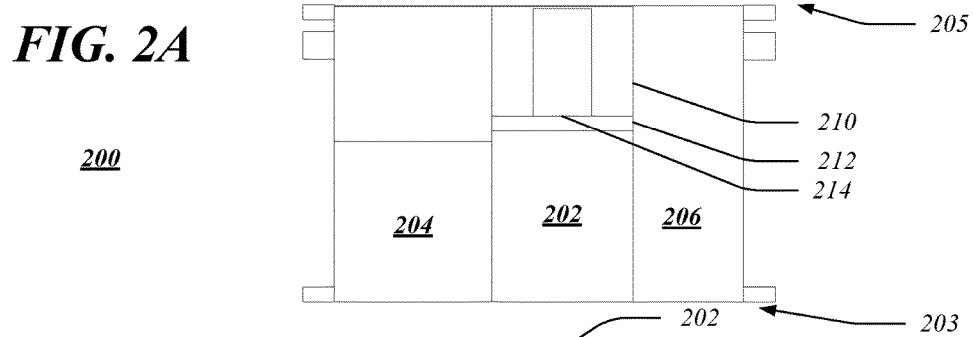
Figure 2C:
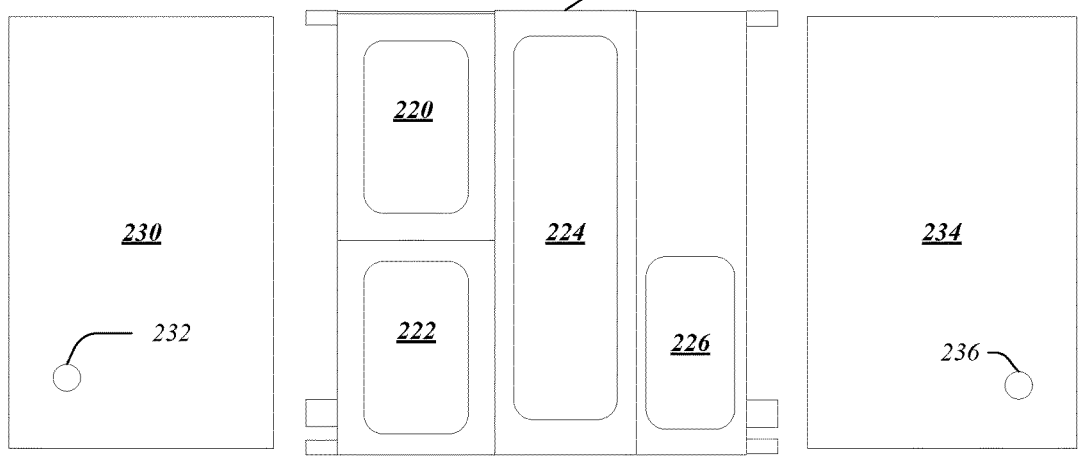

FIGS. 2A to 2E depict different views of a VFD apparatus 200 according to embodiments of the disclosure. In particular, FIG. 2A depicts a top view, FIG. 2B depicts a front view, FIG. 2C depicts a rear view, FIG. 2D depicts a first side view, and FIG. 2E depicts a second side view. As shown in FIG. 2A, a VFD enclosure 202 faces the front 203 of the VFD apparatus 200. A cooling enclosure 210 adjacent the VFD enclosure 202 faces the back 205 of the VFD apparatus. The cooling enclosure 210 includes a heat sink 212 and at least one cooling channel, shown as cooling channel 214, coupled to the heat sink 212.

As shown in FIG. 2B, the VFD enclosure 202 includes a VFD 224. The VFD apparatus 200 also includes an enclosure region 204, including control electronics 220 and high voltage components 222, such as fuses. The VFD apparatus 200 may also include an enclosure 206 adjacent the VFD enclosure 202, where the enclosure 206 includes an electronic filter component 226.

Turning to FIG. 2C, there is shown a back view of the cooling enclosure 210, including a cooling channel 214 located toward the top and a cooling channel 242 located toward the bottom. Also shown is a VFD access plate 240 proving access to VFD components. In addition, there is shown an access plate 244 for an outgoing voltage cable, such as a 600 V cable, as well as an access plate 246 for incoming voltage cable. As further illustrated in FIG. 2D, an incoming voltage connection 232 may be provided on a side 230 of the VFD apparatus 200, and an outgoing voltage connection 236 may be provided on an opposite side 234.

In various embodiments, the VFD apparatus 200 may include features to engage a forklift or other device to transport the VFD apparatus, as generally shown in FIGS. 2A-2E. Additionally, the VFD apparatus 200 may include features (not shown) at the bottom to aid is pulling the VFD apparatus along a surface.

Figure 3A:
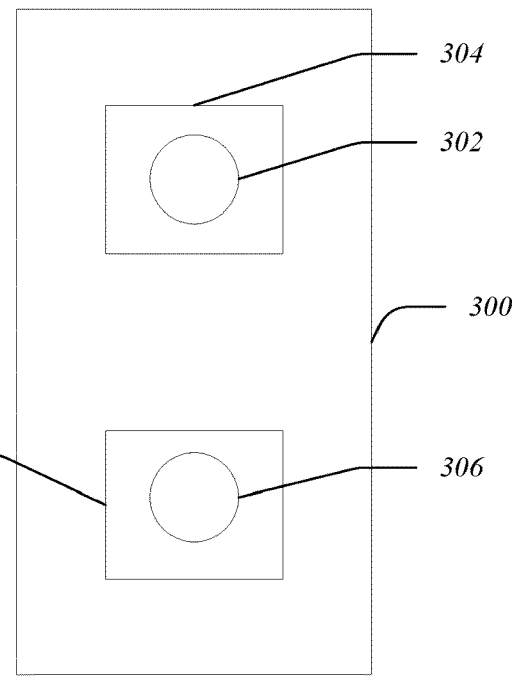
FIG. 3A depicts a rear view of a portion of a VFD apparatus according to embodiments of the disclosure.

FIG. 3A depicts a rear view of a portion of a VFD apparatus according to embodiments of the disclosure. In this example a cooling enclosure 300 may include a first cooling channel 302 and second cooling channel 306 that direct air flow in a manner to cool and clean a heat sink component. The first cooling channel 302 and second cooling channel 306 may flare out to form a rectangular flange 304 and rectangular flange 308, respectively.

Figure 3B:
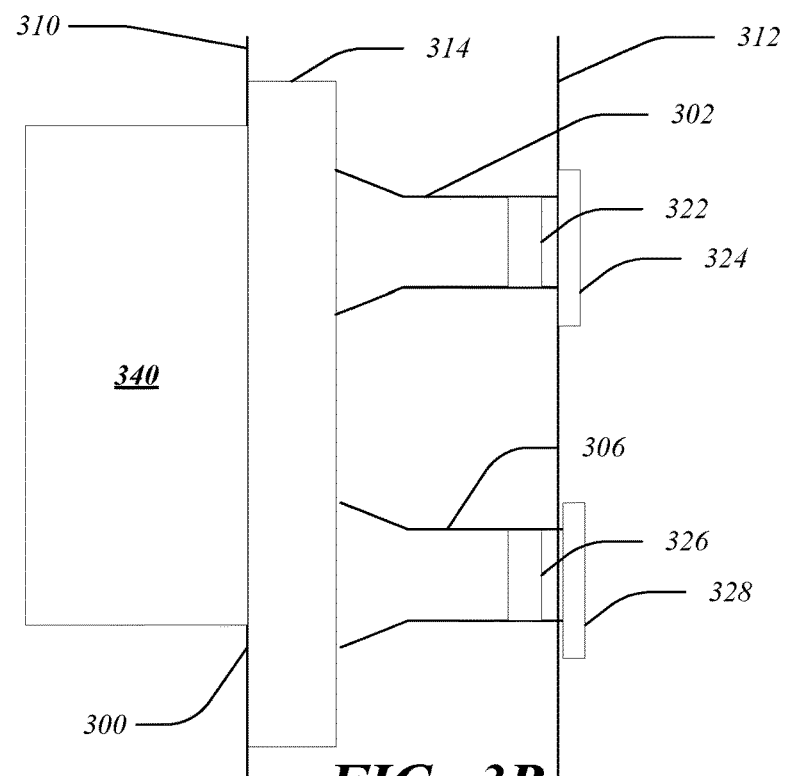
FIG. 3B depicts a side view of the cooling enclosure of FIG. 3A.

FIG. 3B depicts a side view of the cooling enclosure 300 including an outer wall 312 facing ambient conditions and inner wall 310 protecting VFD 340. The cooling enclosure 300 further includes a heat sink/cooling chamber 314 to remove heat from the VFD 340. As further illustrated in FIG. 3B, a first fan 322 may be disposed within the first cooling channel 302 and may direct air flow away from the heat sink/cooling chamber 314. A second fan 326 may be disposed within the second cooling channel 306 and may direct air flow toward the heat sink/cooling chamber 314. A filterless grill 324 may be disposed outside the first cooling channel 302 while a filterless grill 328 is disposed outside the second cooling channel 306.

Figure 4:
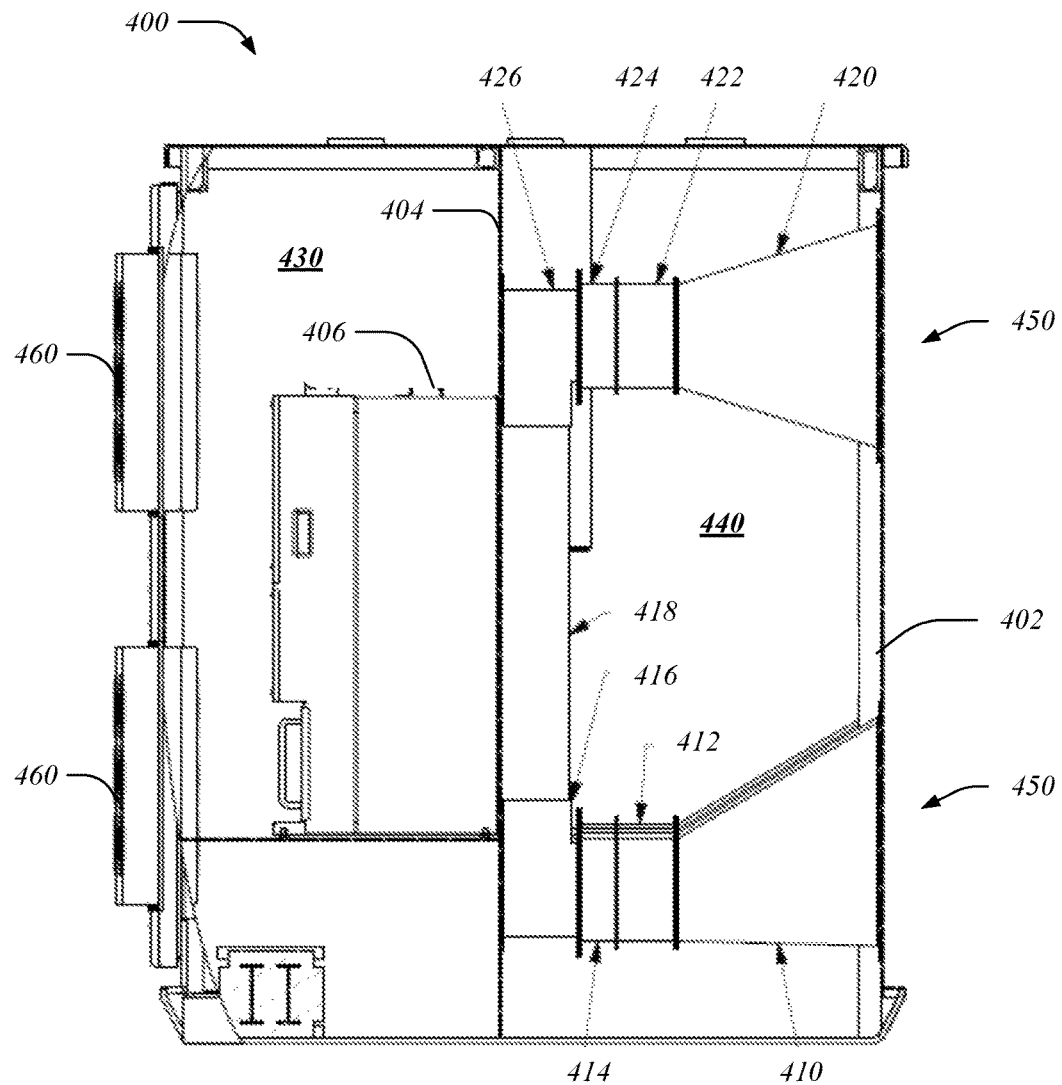
FIG. 4 depicts a side view of a VFD apparatus according to additional embodiments of the disclosure.

FIG. 4 depicts a side view of a VFD apparatus 400 according to additional embodiments of the disclosure. The VFD apparatus 400 may include a housing 402, where the housing 402 includes outer walls of the VFD apparatus 400. The VFD apparatus 400 may include a user interface 460 disposed on an outside of a portion of the housing 402. The VFD apparatus 400 may an inner wall 404, where the inner wall separates a cooling enclosure 440 from a VFD enclosure 430, allowing the VFD enclosure 430 to be sealed from ambient conditions, and preventing dust and other contamination from entering the VFD enclosure 430. The VFD enclosure 430 may house a VFD drive 406 (or simply "VFD"), where the VFD drive 406 is a known type of VFD device.

The VFD apparatus 400 may include a cooling system 450 for cooling the VFD drive 406 and VFD apparatus 400 overall. The cooling system 450 may include a cooling air intake portion 410, where the cooling air intake portion 410 may have a shape that converts from a square cross-section toward the wall of the housing 402 to a round cross-section. The cooling air intake portion 410 may be made from metal duct material, plastic duct material, or other material. The cooling system 450 may further include an intake fan 412 disposed adjacent the cooling air intake portion 410 and a rubber coupler 414 disposed adjacent the intake fan 412, as shown in FIG. 4. The cooling system 450 may further include an adapter 416, where the adapter 416 acts as a 90 degree adapter, coupling the intake region as represented by the cooling air intake portion 410 and intake fan 412, to a heat sink region. As further shown in FIG. 4, a heat sink 418 may be coupled to the adapter 416, and may be mounted on the inner wall 404, immediately adjacent to the VFD drive 406. In one implementation, the heat sink 418 may be a flange mounted heat sink that connects to a back of the VFD drive 406 and extends through the inner wall 404, so the body of the heat sink 418 is disposed in the cooling enclosure 440 while the VFD drive is disposed within the VFD enclosure 430. Such a flange mounted heat sink may seal the VFD enclosure 430 so the VFD enclosure 430 remains sealed from the cooling enclosure 440 and is therefore not subject to particles such as dust or other matter entering the cooling enclosure 440. The heat sink 418 may accordingly be thermally coupled to the VFD drive either through a flange or through the inner wall 404, or both. The heat sink 418 may therefore conduct heat from the VFD drive 406 and from the VFD enclosure 430 generally with the aid or air transported from the intake portion 410. For example, the heat sink 418 may include an enclosure that conducts air received from the adapter 416.

As further shown in FIG. 4, the heat sink 418 may be coupled to an adapter 426, where the adapter 426 acts as a 90 degree adapter, coupling heat sink 418 to an exhaust region. In particular, the exhaust region may include a rubber coupler 424 connected to the adapter 426, an exhaust fan 422 connected to the rubber coupler 424, and an exhaust portion 420 connected to the exhaust fan 422. In some embodiments, the exhaust portion 420 may have a shape that converts from a square cross-section toward the wall of the housing 402 to a round cross-section adjacent the exhaust fan 422. Accordingly, air may be circulated from outside the VFD apparatus 400 through intake portion 410, heat sink 418 and exhaust portion 420 to provide cooling for VFD drive 406.

In various additional embodiments, a VFD apparatus may include multiple VFDs where a given VFD may be arranged in a given VFD enclosure. In this case, a given VFD may additionally be associated with a dedicated electronic filter. The multiple VFDs may be controlled by a common control electronics component and may be linked to a common fuse bank.

In some examples, overall dimensions of a VFD apparatus may be several feet in a given direction. For example, in a long direction along the front the dimensions may be three feet to seven feet. The depth may be, for example, two to three feet, and height three to five feet. The embodiments are not limited in this context.

As used herein, references to "an embodiment," "an implementation," "an example," and/or equivalents is not intended to be interpreted as excluding the existence of additional embodiments also incorporating the recited features.

While the present disclosure has been made with reference to certain embodiments, numerous modifications, alterations and changes to the described embodiments are possible without departing from the sphere and scope of the present embodiments, as defined in the appended claim(s). Accordingly, the present disclosure is not to be limited to the described embodiments, but rather has the full scope defined by the language of the following claims, and equivalents thereof.

The invention claimed is:

1. A variable frequency drive (VFD) apparatus, comprising:
   a VFD enclosure;
   a variable frequency drive (VFD) assembly disposed within the VFD enclosure, and comprising at least one VFD;
   a cooling enclosure separate from the VFD enclosure and disposed adjacent the VFD enclosure such that no part of the VFD enclosure is within the cooling enclosure and no part of the cooling enclosure is within the VFD enclosure;
   a heat sink disposed within the cooling enclosure, the heat sink being thermally coupled to the at least one VFD;
   a fan system disposed within the cooling enclosure to direct a flow of air from outside the cooling enclosure and through the heat sink, wherein the fan system comprises:
   an intake fan to direct the flow of air to the heat sink;
   a cooling air intake portion having a first end disposed on an outer wall of the cooling enclosure and a second end coupled to the intake fan, the cooling air intake portion having a shape that transitions from a square cross-section toward the outer wall of the cooling enclosure to a round cross-section toward the intake fan;
   an exhaust fan to direct the flow of air from the heat sink; and
   an exhaust portion having a first end disposed on an outer wall of the cooling enclosure and a second end coupled to the exhaust fan, the exhaust portion having a shape that transitions from a square cross-section toward the outer wall of the cooling enclosure to a round cross-section toward the exhaust fan.

2. The VFD apparatus of claim 1, wherein the fan system does not include a filter.

3. The VFD apparatus of claim 1, wherein the at least one VFD is adapted to receive a first AC signal from a three phase AC power supply and to output a second AC signal for driving a motor.

* * * * *